United States Patent
Wang et al.

(10) Patent No.: US 7,236,362 B2
(45) Date of Patent: Jun. 26, 2007

(54) MINIMIZATION OF COOLING AIR PREHEAT FOR MAXIMUM PACKAGING DENSITY

(75) Inventors: David G. Wang, San Diego, CA (US); P. Keith Muller, San Diego, CA (US)

(73) Assignee: NCR Corporation, Dayton, OH (US)

( * ) Notice: Subject to any disclaimer, the term of this patent is extended or adjusted under 35 U.S.C. 154(b) by 245 days.

(21) Appl. No.: 10/992,451

(22) Filed: Nov. 18, 2004

(65) Prior Publication Data

US 2006/0104024 A1    May 18, 2006

(51) Int. Cl.
    *H05K 7/20* (2006.01)
(52) U.S. Cl. .............. 361/695; 361/719; 361/721; 174/16.1; 165/80.2; 165/122
(58) Field of Classification Search .............. None
    See application file for complete search history.

(56) References Cited

U.S. PATENT DOCUMENTS

| | | | | |
|---|---|---|---|---|
| 4,612,979 A | * | 9/1986 | Heitzig | 165/129 |
| 4,797,783 A | * | 1/1989 | Kohmoto et al. | 361/695 |
| 5,361,188 A | * | 11/1994 | Kondou et al. | 361/695 |
| 5,528,454 A | * | 6/1996 | Niklos | 361/695 |
| 5,544,012 A | * | 8/1996 | Koike | 361/695 |
| 5,721,670 A | * | 2/1998 | Cochrane et al. | 361/695 |
| 5,995,368 A | * | 11/1999 | Lee et al. | 361/695 |
| 6,283,850 B1 | * | 9/2001 | Toshimitsu et al. | 454/184 |
| 6,400,567 B1 | * | 6/2002 | McKeen et al. | 361/695 |
| 6,421,238 B1 | * | 7/2002 | Negishi | 361/695 |
| 6,459,579 B1 | * | 10/2002 | Farmer et al. | 361/695 |
| 6,678,156 B2 | * | 1/2004 | Moizer | 361/690 |
| 6,717,807 B2 | * | 4/2004 | Hikawa | 361/690 |
| 6,876,549 B2 | * | 4/2005 | Beitelmal et al. | 361/692 |
| 6,912,129 B2 | * | 6/2005 | Baker et al. | 361/695 |
| 2005/0264995 A1 | * | 12/2005 | Hanson | 361/695 |

FOREIGN PATENT DOCUMENTS

| | | | |
|---|---|---|---|
| JP | 56147458 A | * | 11/1981 |
| JP | 01089599 A | * | 4/1989 |
| JP | 04027197 A | * | 1/1992 |
| JP | 05327253 A | * | 12/1993 |

* cited by examiner

*Primary Examiner*—Boris Chervinsky
(74) *Attorney, Agent, or Firm*—Adam Bennett

(57) ABSTRACT

An electronic hardware cabinet includes a forced-air component positioned to force a stream of air to move through the cabinet and at least two electronic assemblies mounted within the cabinet, each of which includes a heat-generating component. The electronic assemblies are positioned so that a portion of the stream of air is heated by a first one of the heat-generating components and, thereafter, that portion of the stream of air moves toward a second one of the heat-generating components. An airflow diverter is positioned between the electronic assemblies to deflect that portion of the stream of air heated by the first heat-generating component to prevent it from reaching the second heat-generating component.

17 Claims, 5 Drawing Sheets

MINIMIZATION OF COOLING AIR PREHEAT FOR MAXIMUM PACKAGING DENSITY

BACKGROUND

The never-ending explosion in computing processing power has led to an even greater explosion in demands on that power, forcing the designers of computer systems to package vast amounts of electronic equipment into relatively small areas. In addition to the cost of acquiring and maintaining the electronic equipment itself, large and complex computer systems, such as server farms and large data centers, carry additional infrastructure costs, including the costs of real-estate and cooling systems. Because these infrastructure costs are often very high, the owners of these large systems are moving towards ever higher packaging densities, placing as much computing power as possible in each square foot of space.

The owners of complex systems such as server farms and data centers achieve high packaging density by packing more computer equipment in both horizontal and vertical directions. By way of example, the 5380 Server system produced by NCR Corporation is delivered with up to 512 computing nodes, each with as many as four CPUs, stacked in a cabinet that is only 77 inches tall by 24.5 inches wide by 40 inches deep.

While packing computer components this densely solves many of the problems facing the owners of such systems, it also creates another set of challenges, in particular the proper cooling of heat-generating components, especially the CPUs, within such systems. In attempting to alleviate these cooling problems, designers of this type of equipment use forced-air cooling techniques that are aimed at moving cold air from a cold-air source to the hot components inside the cabinet. Forced-air cooling comes in two basic forms—front-to-back cooling and bottom-to-top cooling. The form that is most appropriate in any particular hardware environment and configuration is governed by how the pieces of equipment are physically packaged and electrically connected together.

FIG. 1 is a side view of a server rack 100 that uses bottom-to-top cooling to accommodate the particular packaging needs of the components in the rack. As shown here, the rack 100 includes four vertically mounted rows of printed circuit assemblies, or electronic assemblies $110_{1 \ldots N}$, each having one or more heat-generating components, such as the central processing units (CPUs) $115_{1 \ldots M}$. Thermal energy dissipated by the CPUs $115_{1 \ldots M}$ and other active and heat-dissipating integrated circuit devices on the electronic assemblies $110_{1 \ldots N}$ is removed from the electronic assemblies $110_{1 \ldots N}$ by a flow 160 of cooling air that moves from the bottom of the rack 100 to the top. As the air flows past these devices, the temperature of the air rises, so that the air at the top of the cabinet is considerably warmer than the air at the bottom. The cooling effect of the air is bolstered by fan trays $140_{1 \ldots K}$ that serve to pull greater volumes of cool air through the rack, thereby increasing air-flow velocity over the CPUs $115_{1 \ldots M}$ and other components on the electronic assemblies $110_{1 \ldots N}$. Nevertheless, the air passing over the components at the top of the rack 100 is considerably warmer, and thus has less cooling capacity, than the air passing over components at the bottom of the rack 100. With electronic components, particularly CPUs, growing increasingly hotter with normal operation, cooling is quickly becoming the deciding factor in determining the vertical density of a server rack.

SUMMARY

An electronic hardware cabinet includes a forced-air component positioned to force a stream of air to move through the cabinet, and at least two electronic assemblies, mounted within the cabinet, each of which includes a heat-generating component. The electronic assemblies are positioned so that a portion of the stream of air is heated by a first one of the heat-generating components and, thereafter, that portion of the stream of air moves toward a second one of the heat-generating components. An airflow diverter is positioned between the electronic assemblies to deflect that portion of the stream of air heated by the first heat-generating component to prevent it from reaching the second heat-generating component.

In some systems, the airflow diverter is positioned to direct the portion of the stream of air heated by the heat-generating component into a hot-air path in the cabinet, and it often includes one or more walls or surfaces that taper toward the hot-air path. This hot-air path often includes a channel that is formed between at least one of the electronic assemblies and a wall of the cabinet. The cabinet often includes a hot-air exhaust port through which air in the hot-air path exits the cabinet.

In other systems, the airflow diverter is positioned also to direct that portion of the stream of air toward the first one of the heat-generating components before the first one of the heat-generating components heats it. Often that portion of the stream of air is directed from a cool-air path. This cool-air path often includes a channel that is formed between at least one of the electronic assemblies and a wall of the cabinet. The cabinet often includes of a cool-air inlet port through which the portion of the stream of air in the cool-air path enters the cabinet.

In some systems the airflow diverter is positioned also to direct another portion of the stream of air toward the second heat-generating component.

In another aspect, an electronic hardware cabinet includes a forced-air component positioned to force a stream of air to move through the cabinet, and at least two vertically stacked electronic assemblies, mounted within the cabinet, each of which include a heat-generating component. The electronic assemblies are stacked so that a portion of the stream of air is heated by a first heat-generating component on a lower electronic assembly, and, thereafter, that portion of the stream of air moves towards a second heat-generating component on a higher electronic assembly. An airflow diverter is positioned to deflect that portion of the stream of air, heated by the first heat-generating component, to prevent it from reaching the second heat-generating component.

In some systems, the airflow diverter is positioned beside the lower electronic assembly, while in other systems it is positioned between the lower electronic assembly and the higher electronic assembly. In both of these systems, the airflow diverter is positioned to direct the portion of the stream of air heated by the first heat-generating component along a hot-air path in the cabinet.

In another aspect, an electronic hardware cabinet includes a forced-air component positioned to force a stream of air to move through the cabinet and at least two groups of electronic assemblies stacked vertically within the cabinet, one above the other. Each of the electronic assemblies in each group has at least one heat-generating component. Multiple airflow diverters are placed among the electronic assemblies to deflect a portion of the stream of air, heated by the heat-generating components in one group, to prevent it from reaching the heat-generating components in the other group.

In some systems the airflow diverters are positioned between the electronic assemblies in the group that is lower in the cabinet, while in other systems, the airflow diverters are positioned between the two groups of electronics assemblies.

In other aspects, an electronic hardware cabinet includes a forced-air component positioned to force a stream of air through the cabinet and a first and second electronic assembly, both having a heat-generating component. A first airflow diverter is positioned to direct at least a first portion of the stream of air over the heat-generating component on the first electronic assembly, thereby heating the first portion of the stream of air. The airflow diverter is positioned such that the air stream, after it is heated, is directed away from the second assembly.

In some systems, the first airflow diverter directs the heated first portion of the stream of air into a hot-air path in the cabinet. Often the cabinet also includes a third electronic assembly having a third heat-generating component and a second airflow diverter. This second airflow diverter is positioned to direct a second portion of the stream of air over the heat-generating component on the second electronic assembly, thereby heating the second portion of the stream of air. After the second portion of the stream of air is heated, the second airflow diverter directs it away from the third electronic assembly and into the hot air path.

DETAILED DESCRIPTION

Figure 1:
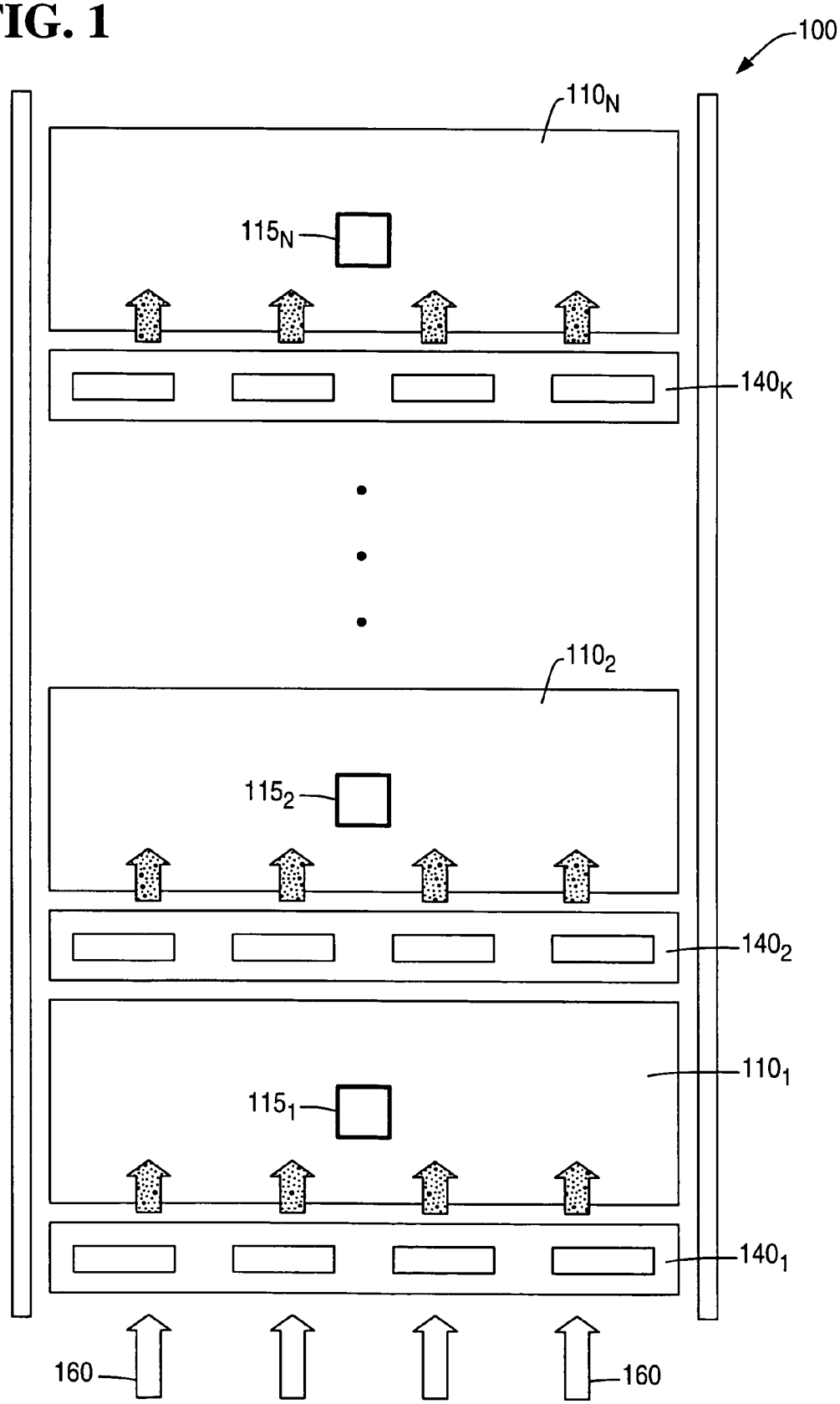
FIG. 1 is a schematic of a side view of a server rack that utilizes bottom to top cooling to accommodate the particular packaging needs of the rack.
Figure 2:
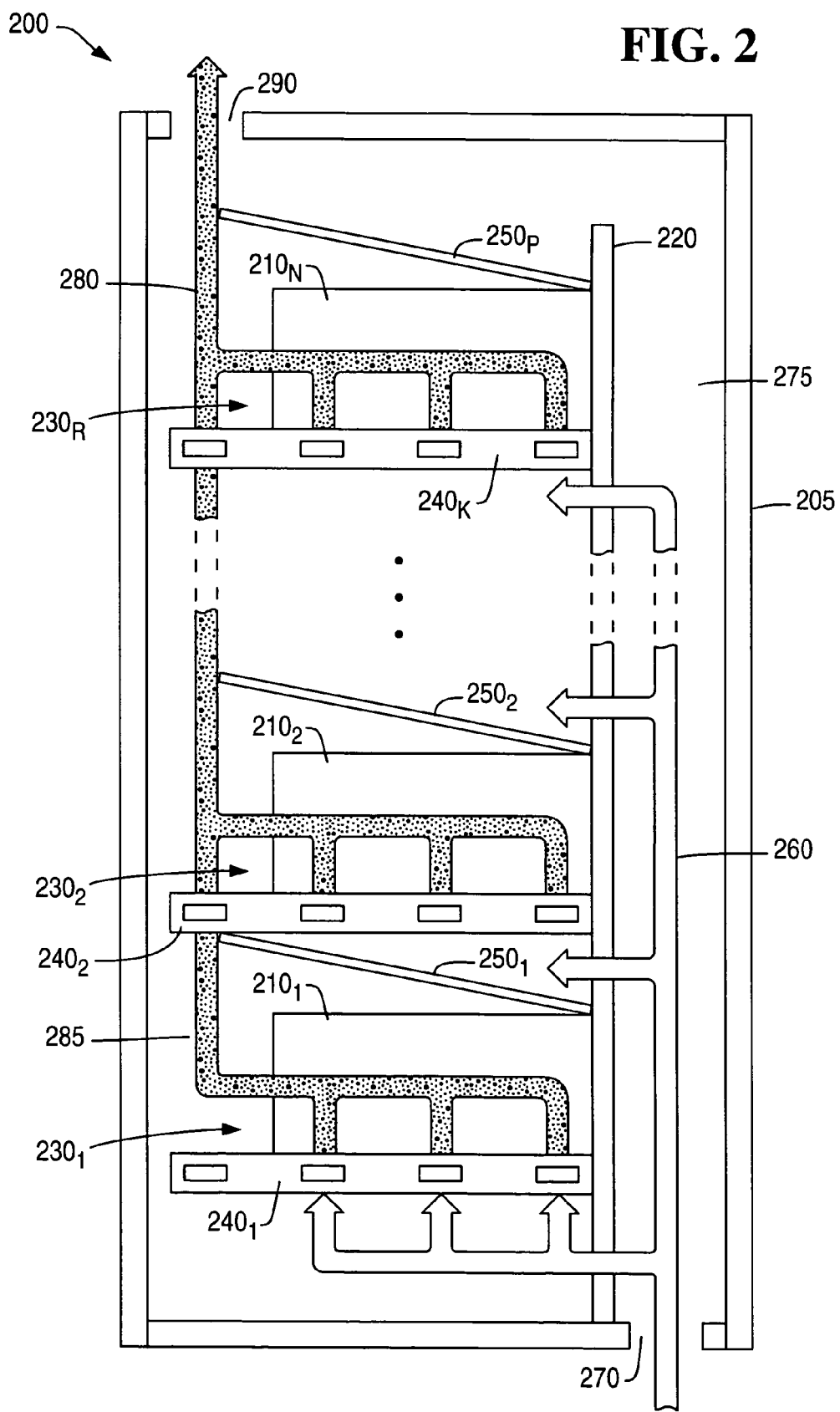
FIG. 2 is a schematic side view diagram of a hardware cabinet according to one embodiment of the present invention.

FIG. 2 shows a hardware cabinet 200 that includes a housing 205 and one or more electronic-component assemblies, or simply "electronic assemblies" $210_{1 \ldots N}$, mounted within the housing 205. The cabinet 200 includes a mounting frame 220, or "rack," to which the electronic assemblies $210_{1 \ldots N}$ mount. In most systems, the electronic assemblies $210_{1 \ldots N}$ are mounted in groups $230_{1 \ldots R}$, side-by-side, at various heights within the cabinet 200. For each of the groups $230_{1 \ldots R}$ of electronic assemblies, the cabinet 200 includes an airflow-assistance mechanism, such as an array of fans, or fan tray $240_{1 \ldots K}$, which forces cool air over the electronic assemblies $210_{1 \ldots N}$ in the group. In most systems, the fan trays $240_{1 \ldots K}$ sit below one of the groups $230_{1 \ldots R}$ of electronic assemblies.

Between each of the groups $230_{1 \ldots R}$ of electronic assemblies is an airflow diverter, such as one of the airflow baffles $250_{1 \ldots P}$, that directs air flowing through the electronic assemblies $210_{1 \ldots N}$ along desired paths. In general, a stream 260 of cold air enters the cabinet through an opening, or intake port 270, in the housing 205 and passes through a cold-air chimney 275. The fan trays $240_{1 \ldots K}$ siphon cold air from the cold-air stream 260 and force the cold air over the electronic assemblies $210_{1 \ldots N}$ in each of the corresponding groups $230_{1 \ldots R}$. As the cold air moves over the electronic assemblies $210_{1 \ldots N}$ in the each of the groups $230_{1 \ldots R}$, the air removes heat that is generated by active components within the electronic assemblies. In doing so, the air itself heats up, typically to the point that it retains little or no cooling potential. However, instead of allowing this heated air to pass over electronic assemblies elsewhere in the cabinet 200, the airflow baffles $250_{1 \ldots P}$ direct the heated air away from the other assemblies and into a hot-air stream 280 that forms within a hot-air chimney 285. The hot-air stream 280 exits the cabinet 200 through another opening, an exhaust port 290, formed in the housing 205.

The airflow baffles $250_{1 \ldots P}$ are mounted within the cabinet 200 in any one of a variety of ways. For instance, in some systems the airflow baffles $250_{1 \ldots P}$ comprise an integral part of the mounting frame 220. In other systems, an existing mounting frame 220 is retrofitted with airflow baffles $250_{1 \ldots P}$. Alternatively, in many systems, one end of the airflow baffle $250_{1 \ldots P}$ fastens to one or more of the electronic assemblies $210_{1 \ldots N}$ within one of the groups $230_{1 \ldots R}$ and the opposing end of the airflow baffle $250_{1 \ldots P}$ fastens to the adjacent fan tray $240_{1 \ldots K}$. Mounting the airflow baffles $250_{1 \ldots P}$ within the cabinet 200 in a manner such as these provides an effective mechanism for ensuring that each of the groups $230_{1 \ldots R}$ of electronic assemblies, regardless of its location within the cabinet, has access to cold air from the cold-air stream 260 without interference from the hot exhaust air generated elsewhere in the cabinet.

Figure 3:
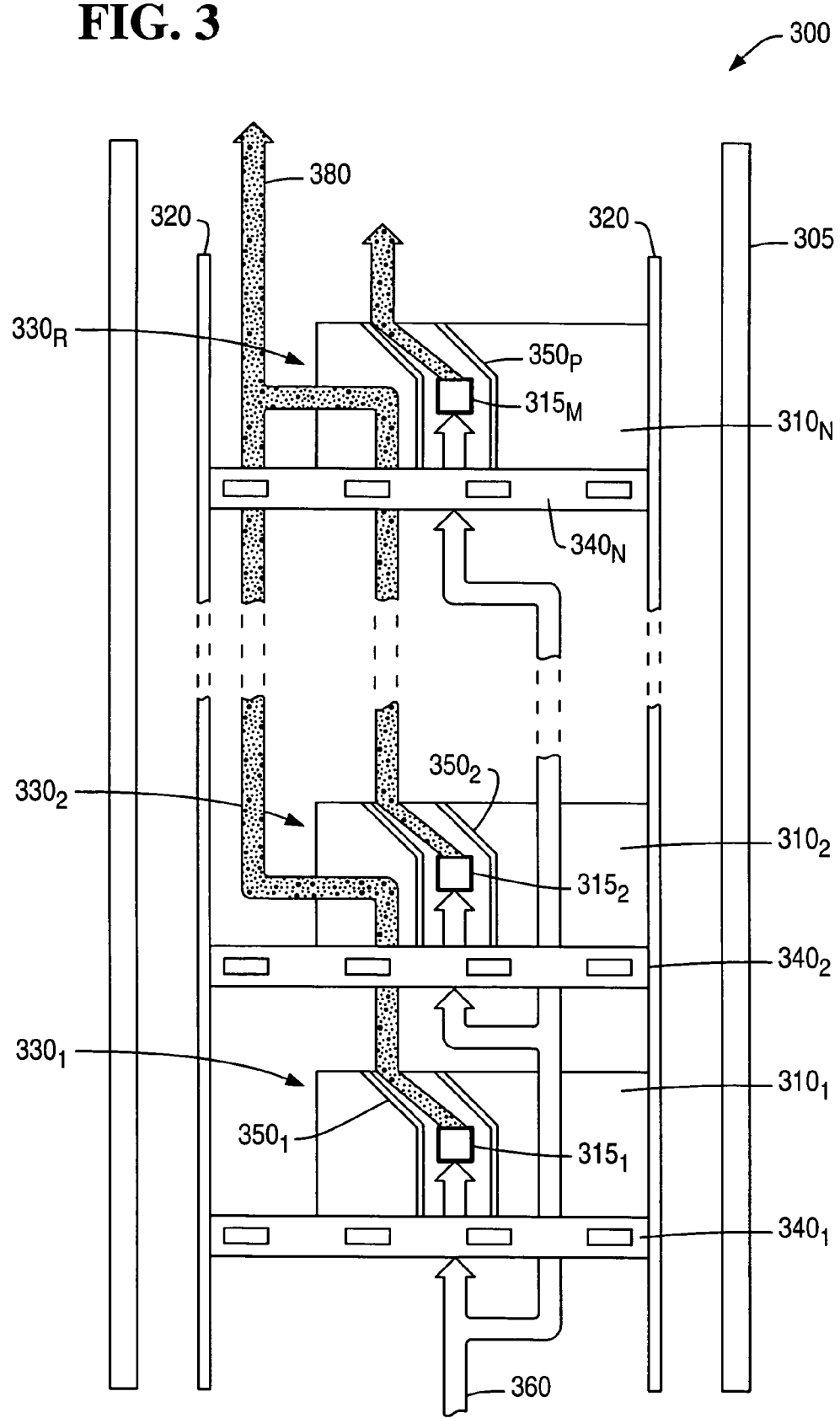
FIG. 3 is a schematic side view diagram of a hardware cabinet according to one embodiment of the present invention.

FIG. 3 also shows a hardware cabinet 300 that includes a housing 305 and one or more electronic assemblies $310_{1 \ldots N}$ mounted within the housing 305. This cabinet also includes a mounting frame, or "rack" 320, to which the electronic assemblies $310_{1 \ldots N}$ mount. The electronic assemblies $310_{1 \ldots N}$ are mounted in groups $330_{1 \ldots R}$ side-by-side, at various levels within the cabinet 300, and for each of the groups $330_{1 \ldots R}$ an airflow assistance mechanism, such as one of the fan trays $340_{1 \ldots K}$, forces cool air over the electronic assemblies $310_{1 \ldots N}$ of that group. The fan trays $340_{1 \ldots K}$ typically sit below the electronic assemblies $310_{1 \ldots N}$ of each of the groups $330_{1 \ldots R}$.

Mounted on each of the electronic assemblies $310_{1 \ldots N}$ is at least one heat-dissipating component, such as one of the CPUs $315_{1 \ldots M}$. In terms of CPU placement, all the electronic assemblies $310_{1 \ldots N}$ are typically (though not always) identical or nearly identical. An airflow diverter, such as one of the airflow baffles $350_{1 \ldots P}$ is positioned adjacent to each electronic assembly to form a duct around the corresponding CPU $315_{1 \ldots M}$. The duct formed by each of the airflow baffles $350_{1 \ldots P}$ directs cool air over one of the CPUs $315_{1 \ldots M}$ and then away from that CPU and the corresponding electronic assembly. At least some portion of each of each of the airflow baffles $350_{1 \ldots P}$ is angled to direct the air that is heated by the CPU $315_{1 \ldots M}$ away form other CPUs sitting higher in the cabinet 300. While the system described here shows airflow baffles $350_{1 \ldots P}$ around all CPUs $315_{1 \ldots M}$ at all levels in the cabinet, some systems do not include airflow baffles for all the CPUs.

As with the system in FIG. 2, a stream of cold air 360 enters the cabinet 300 of FIG. 3 through one or more openings in the bottom of the housing 305, and the fan trays $340_{1 \ldots K}$ drive cold air from the cold air stream 360 over the electronic assemblies $310_{1 \ldots N}$. As the cold air moves over the electronic assemblies $310_{1 \ldots N}$ in each of the groups $330_{1 \ldots R}$, the airflow baffles $350_{1 \ldots P}$ direct cool air over each of the CPUs $315_{1 \ldots M}$ to remove heat generated by those components. The design of the airflow baffles $350_{1 \ldots P}$ in FIG. 3 allows each airflow baffle to direct the newly heated air away from other CPUs and heat-generating components at higher levels in the cabinet 300 and into a hot-air stream 380 that bypasses those components. Ultimately, the heated air from the hot-air stream 380 exits the cabinet 300 through one or more openings formed in the housing 305, usually at the top of the housing.

The airflow baffles $350_{1 \ldots P}$ mount to the electronic assemblies $310_{1 \ldots N}$, forming an angled duct around each of the CPUs $315_{1 \ldots M}$. The airflow baffles $350_{1 \ldots P}$ are mounted in any one of a variety of ways. For instance, in some systems each of the airflow baffles $350_{1 \ldots P}$ may consist of two individual wall portions mounted to one of the electronic assemblies $310_{1 \ldots N}$, one on either side of the CPU. The individual wall portions extend from each of the electronic assemblies $310_{1 \ldots N}$ to the backside of an adjacent electronic assembly, defining an air duct around each of the CPUs $315_{1 \ldots M}$. In other systems, each of the airflow baffles $350_{1 \ldots P}$ consists of a housing mounted to each of the electronic assemblies $310_{1 \ldots N}$ over the corresponding CPU $315_{1 \ldots M}$ to form a duct around that CPU. Alternatively, in some systems the airflow baffles $350_{1 \ldots P}$ mount directly to the component rack 320 and not to the electronic assemblies $310_{1 \ldots N}$ themselves. Mounting the airflow baffles $350_{1 \ldots P}$ in these or equivalent manners provides an effective mechanism for ensuring that each of the CPUs $315_{1 \ldots M}$ on each of the electronic assemblies $310_{1 \ldots N}$, regardless of its location within the cabinet 300, has access to cold air without interference from the hot exhaust air generated by CPUs $315_{1 \ldots M}$ lower in the cabinet.

Figure 4:
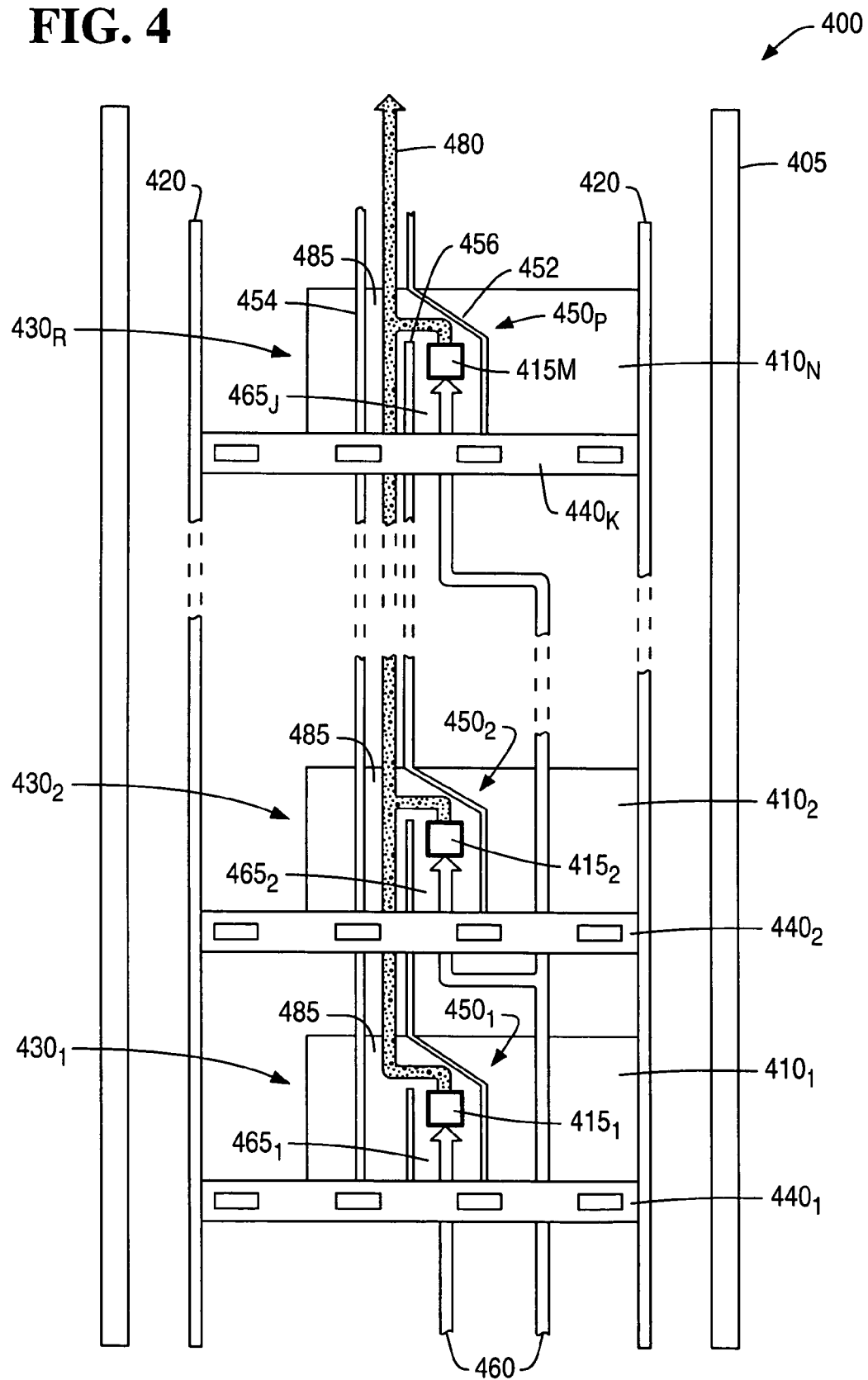
FIG. 4 is a schematic side view diagram of a hardware cabinet according to one embodiment of the present invention.

FIG. 4 shows a hardware cabinet 400 that includes a housing 405, a rack 420, electronic assemblies $410_{1 \ldots N}$ mounted in groups $430_{1 \ldots R}$, CPUs $415_{1 \ldots M}$ and fan trays $440_{1 \ldots K}$, all of which are arranged identically to the corresponding components of FIG. 3. FIG. 4 also depicts airflow diverters, or airflow baffles $450_{1 \ldots P}$, associated with each of the electronic assemblies $410_{1 \ldots N}$.

At each level in the cabinet, the airflow baffles $450_{1 \ldots P}$ force a cool air stream 460 to flow over the CPUs $415_{1 \ldots M}$ at that level, which in turn heat the air flowing in the stream. Instead of allowing this heated air to pass over other CPUs higher in the cabinet 400, however, the airflow baffles $450_{1 \ldots P}$ direct the heated air into a hot-air stream 480 that forms with in a hot-air chimney 485. The hot-air chimney 485 isolates the hot-air stream 480 from other CPUs and heat-generating components, directing the heated air from the hot-air stream 480 to exit the cabinet 400 through one or more exit ports formed in the housing 405, usually at the top of the housing.

The airflow baffles $450_{1 \ldots P}$ in this embodiment form both an angled air duct $465_{1 \ldots J}$ around each of the CPUs $415_{1 \ldots M}$ and a hot-air chimney portion. The hot-air chimney portions formed by the airflow baffles $450_{1 \ldots P}$ are interconnected with each other to form a hot-air chimney 485 that extends upward through the rack.

The airflow baffles $450_{1 \ldots P}$ are mounted within the cabinet 400 in any one of a variety of ways. For instance, in some systems, each of the airflow baffles $450_{1 \ldots P}$ may consist of three individual wall portions mounted to each of the electronic assemblies $410_{1 \ldots N}$. Two outer portions, or the tapered portion 452 and the chimney portion 454, define the outer boundary of each of the airflow baffles $450_{1 \ldots P}$. The tapered portion 452 tapers toward the chimney portion 454 for directing air into the hot-air chimney 485. The third individual wall portion, or inner wall 456, resides between the other two, defining a barrier between the angled air duct $465_{1 \ldots J}$ on one side and the hot-air chimney 485 on the other side. These three individual wall portions typically extend from each of the electronic assemblies $410_{1 \ldots N}$ to the backside of an adjacent electronic assembly, defining an air duct around each of the CPUs $415_{1 \ldots M}$ and a hot-air chimney portion extending away from the electronic assembly.

In other systems, each of the airflow baffles $450_{1 \ldots P}$ is a housing mounted to one of the electronic assemblies $410_{1 \ldots N}$ over one of the CPUs $415_{1 \ldots M}$ to form a duct around that CPU which leads to a hot-air chimney portion. In other systems, the airflow baffles $450_{1 \ldots P}$ mount directly to the component rack 420. Mounting the baffles in a manner such as these provides an effective mechanism for ensuring that each of the CPUs $415_{1 \ldots M}$ on each of the electronic assemblies $410_{1 \ldots N}$, regardless of its location within the cabinet 400, has access to cold air without interference from the hot exhaust air generated by CPUs lower in the cabinet.

Figure 5:
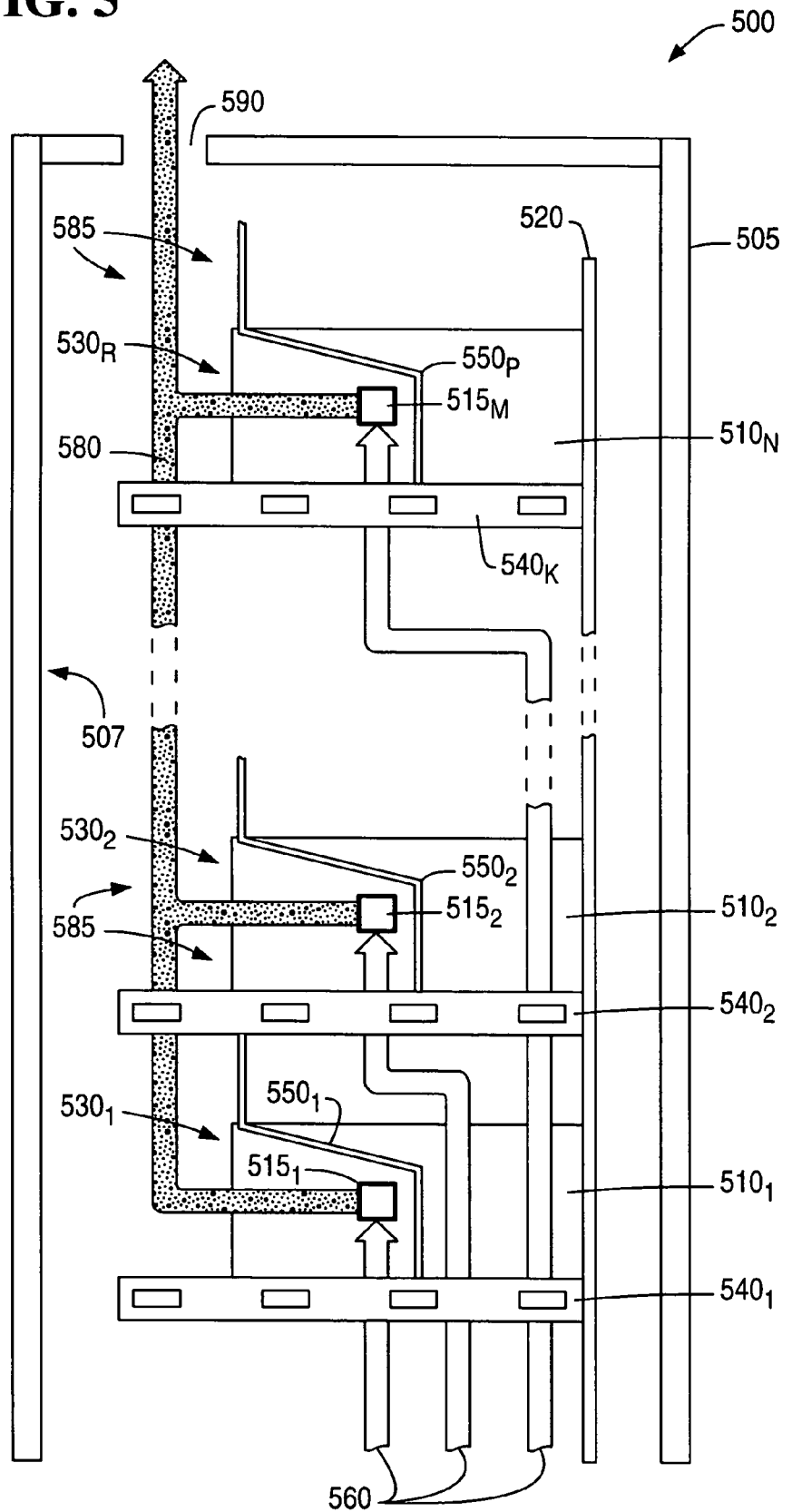
FIG. 5 is a schematic side view diagram of a hardware cabinet according to one embodiment of the present invention.

FIG. 5 shows a hardware cabinet 500 that includes a housing 505, a rack 520, electronic assemblies $510_{1 \ldots N}$ mounted in groups $530_{1 \ldots R}$, CPUs $515_{1 \ldots M}$ and fan trays $540_{1 \ldots K}$, all of which are arranged identically to the corresponding components of FIG. 3 and FIG. 4. In most systems, associated with each of the electronic assemblies $510_{1 \ldots N}$ is an airflow diverter, such as one of the airflow baffles $550_{1 \ldots P}$ that forces air to flow over each of the corresponding CPUs $515_{1 \ldots M}$ and then diverts the air into a hot-air stream 580 that forms within a hot-air chimney 585. The hot-air chimney 585 is formed between the cabinet wall 507 and the outer perimeter of the groups $530_{1 \ldots R}$ of electronic assemblies, so that the hot-air stream 580 passes through a gap between the electronic assemblies $510_{1 \ldots N}$ and the cabinet wall 507 and not over the electronic assemblies themselves. The hot-air stream 580 exits the cabinet 500 through one or more openings, such as an exhaust port 590, formed in the housing 505.

The airflow baffles $550_{1 \ldots P}$ are mounted within the cabinet 500 in any one of a variety of ways. For instance, in some systems, the airflow baffles $550_{1 \ldots P}$ comprise an integral part of the mounting frame 520, or an existing mounting frame 520 can be retrofitted with airflow baffles $550_{1 \ldots P}$. Alternatively, in other systems, the airflow baffles $550_{1 \ldots P}$ include an individual angled wall portion mounted to each of the electronic assemblies $510_{1 \ldots N}$ on the side of the CPU opposite the hot-air chimney 585. The individual wall portion extends from the each of the electronic assemblies $510_{1 \ldots N}$ to the backside of an adjacent electronic assembly, defining a barrier between the CPU $515_{1 \ldots M}$ on that electronic assembly and CPUs at higher levels within the hardware cabinet 500. In other systems, the each of the airflow baffles $550_{1 \ldots P}$ consists of a housing mounted to each of the electronic assemblies $510_{1 \ldots N}$ over each of the corresponding CPUs $515_{1 \ldots M}$ to form a duct around the CPU. Mounting the airflow baffles $550_{1 \ldots P}$ within the cabinet 500 in a manner such as these provides an effective mechanism for directing hot-air into the hot-air chimney 585 and for ensuring that each of the groups $530_{1 \ldots R}$ of electronic assemblies, regardless of its location within the cabinet, has access to cold air from the cold-air stream 560 without interference from the hot exhaust air generated elsewhere in the cabinet.

The text above describes one or more specific embodiments of a broader invention. The invention also is carried out in a variety of alternative embodiments and thus is not limited to those described here.

For example, while the systems shown here are described in terms of cooling CPUs, the cooling techniques described are useful in cooling any type of heat-dissipating component in a hardware cabinet.

Also, while the systems shown here each include a fan tray for each group of electronic assemblies, the described techniques work just as well for systems having a single fan tray of single fan for the entire cabinet. In such an embodiment, the single fan or single fan tray can be located at any suitable location, either inside or outside of the cabinet.

Likewise, while the systems shown here all involve a flow of air from the bottom to the top of the cabinet, the described techniques are equally useful for systems in which air flows in other directions, such as front to back. Also, while the embodiments of FIG. 3, FIG. 4 and FIG. 5 are all described separately, the structures they show are equally useful when used in any combination within a single hardware cabinet.

Moreover, while several of the specific embodiments indicate using cool air or cold air, a person skilled in the art will understand that these terms include not only air that has been mechanically and/or chemically cooled, but also air that is taken from the surrounding ambient environment.

Many other embodiments are also within the scope of the following claims.

We claim:

1. An electronic hardware cabinet comprising:
   a forced-air component positioned to force a stream of air to move through the cabinet;
   at least two electronic assemblies mounted within the cabinet, where each of the electronic assemblies includes a heat-generating component, and
   an airflow-diverter defining an airflow channel around a first heat-generating component on a first of the electronic assemblies,
   wherein the airflow diverter is positioned to (i) channel a portion of the stream of air directly over the first heat-generating component, whereby the portion of the stream of air is heated, and (ii) divert the heated portion of the stream of air away from a second heat-generating component on a second of the electronic assemblies.

2. The electronic hardware cabinet of claim 1, wherein the airflow diverter is positioned to direct the heated portion of the stream of air into a hot-air path in the cabinet.

3. The electronic hardware cabinet of claim 2, wherein the hot-air path is positioned to one side of the first heat-generating component and at least a portion of the airflow diverter is positioned to the other side of the first heat-generating component, and wherein at least a portion of the airflow diverter tapers toward the hot-air path to direct the heated portion of the stream of air into the hot-air path.

4. The electronic hardware cabinet of claim 2, wherein the airflow diverter has at least two walls which flank the heat-generating component.

5. The electronic hardware cabinet of claim 4, wherein at least one of the walls tapers toward the other wall to direct the air into the hot-air path.

6. The electronic hardware cabinet of claim 2, wherein the hot-air path includes a channel that is formed between at least one of the electronic assemblies and a wall of the cabinet.

7. The electronic hardware cabinet of claim 2, wherein the cabinet also includes a hot-air exhaust port through which air in the hot-air path exits the cabinet.

8. The electronic hardware cabinet of claim 1, wherein the airflow diverter is positioned to direct the portion of the stream of air from a cool-air path.

9. The electronic hardware cabinet of claim 8, wherein the cool-air path includes a channel that is formed between at least one of the electronic assemblies and a wall of the cabinet.

10. The electronic hardware cabinet of claim 8, where the cabinet also includes a cool-air inlet port through which the portion of the stream of air in the cool-air path enters the cabinet.

11. The electronic hardware cabinet of claim 1, wherein the airflow diverter is mounted on the first of the electronic assemblies.

12. The electronic hardware cabinet of claim 1, further comprising:
    a third electronic assembly having a third heat-generating component; and
    a second airflow diverter positioned to (i) channel a second portion of the stream of air directly over the second heat-generating component, whereby the second portion of the stream of air is heated, and (ii) divert the heated second portion of the stream of air away from a third heat-generating component on third electric assembly.

13. An electronic hardware cabinet comprising:
    a forced-air component positioned to force a stream of air to move through the cabinet;
    at least two vertically stacked electronic assemblies mounted within the cabinet, where each electronic assembly has at least one heat-generating component, and
    an airflow diverter defining a channel around a first heat generating component on a lower electronic assembly, wherein the airflow-diverter is positioned to (i) channel a portion of the stream of air directly over the first heat-generating component, whereby the portion of the stream of air is heated, and (ii) divert the heated portion of the stream of air away from a second heat-generating component on a higher electronic assembly.

14. The cabinet of claim 13, wherein the airflow diverter is positioned beside the first heat-generating component.

15. The electronic hardware cabinet of claim 13, wherein the airflow diverter is mounted on the lower electronic assembly.

16. An electronic hardware cabinet comprising:
    a forced-air component positioned to force a stream of air to move through the cabinet;
    at least two groups of electronic assemblies, including a lower group and a higher group, stacked vertically within the cabinet with one group positioned above the other, wherein each electronic assembly in each group has at least one heat-generating component; and
    multiple airflow diverters positioned among the electronic assemblies in the lower group to (i) direct a stream of air directly over each heat-generating component in the lower group, whereby the stream of air is heated, and (ii) divert the heated stream of air away from the heat-generating components in the higher group.

17. The cabinet of claim 16, where at least some of the airflow diverters are positioned between the electronic assemblies in the lower group.

* * * * *